United States Patent
Lim

(10) Patent No.: US 10,521,353 B2
(45) Date of Patent: Dec. 31, 2019

(54) DATA STORAGE DEVICE AND OPERATING METHOD THEREOF

(71) Applicant: SK hynix Inc., Gyeonggi-do (KR)

(72) Inventor: Su Jin Lim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 315 days.

(21) Appl. No.: 15/260,523

(22) Filed: Sep. 9, 2016

(65) Prior Publication Data
US 2017/0309343 A1    Oct. 26, 2017

(30) Foreign Application Priority Data
Apr. 21, 2016   (KR) .................. 10-2016-0048800

(51) Int. Cl.
  *G06F 12/00*   (2006.01)
  *G06F 12/1009*   (2016.01)
  *G11C 16/26*   (2006.01)

(52) U.S. Cl.
  CPC .......... *G06F 12/1009* (2013.01); *G11C 16/26* (2013.01); *G06F 2212/65* (2013.01)

(58) Field of Classification Search
  CPC .................................................. G11C 16/26
  See application file for complete search history.

(56) References Cited

U.S. PATENT DOCUMENTS

| 2015/0332777 | A1* | 11/2015 | Yoon | G11C 11/5642 714/764 |
| 2015/0339057 | A1* | 11/2015 | Choi | G06F 3/061 711/103 |
| 2016/0125951 | A1* | 5/2016 | Sun | G11C 11/5642 365/185.24 |

FOREIGN PATENT DOCUMENTS

KR   1020150133916   12/2015

* cited by examiner

*Primary Examiner* — Baboucarr Faal
(74) *Attorney, Agent, or Firm* — IP & T Group LLP

(57) ABSTRACT

A data storage device includes a nonvolatile memory device and a controller configured to control an operation of the nonvolatile memory device. The controller includes an RAM in which a category table that categories with respect to LBAs are defined and a read voltage table that read voltages with respect to the categories are set are stored and a controller configured to, when a read request and an LBA to be read are received from a host apparatus, determine a category corresponding to the LBA with reference to the category table and perform a read operation on a read-requested memory cell of the nonvolatile memory device by applying a read voltage corresponding to the determined category to the memory cell with reference to the read voltage table.

19 Claims, 10 Drawing Sheets

READ VOLTAGE TABLE (RVT)

| Category | RV | | | RVAL |
|---|---|---|---|---|
| System data | $Vrd\_s$ | | | $\Delta Vs$ |
| FW data | $Vrd\_f$ | | | $\Delta Vf$ |
| Hot data | $Vrd\_h1$ | $Vrd\_h2$ | $Vrd\_h3$ | $\Delta Vh$ |
| Cold data | $Vrd\_c1$ | $Vrd\_c2$ | $Vrd\_c3$ | $\Delta Vc$ |

FIG.2

CATEGORY TABLE (CT)

| LBA | Category |
|---|---|
| 0 | System data |
| ⋮ | |
| 1000 | |
| 1001 | FW data |
| ⋮ | |
| 1200 | |
| 1201 | Hot data |
| ⋮ | |
| 1300 | |
| 1301 | Cold data |
| ⋮ | |
| 1600 | |
| ⋮ | ⋮ |

FIG.3

READ VOLTAGE TABLE (RVT)

| Category | RV | | | RVAL |
|---|---|---|---|---|
| System data | $Vrd\_s$ | | | $\Delta Vs$ |
| FW data | $Vrd\_f$ | | | $\Delta Vf$ |
| Hot data | $Vrd\_h1$ | $Vrd\_h2$ | $Vrd\_h3$ | $\Delta Vh$ |
| Cold data | $Vrd\_c1$ | $Vrd\_c2$ | $Vrd\_c3$ | $\Delta Vc$ |

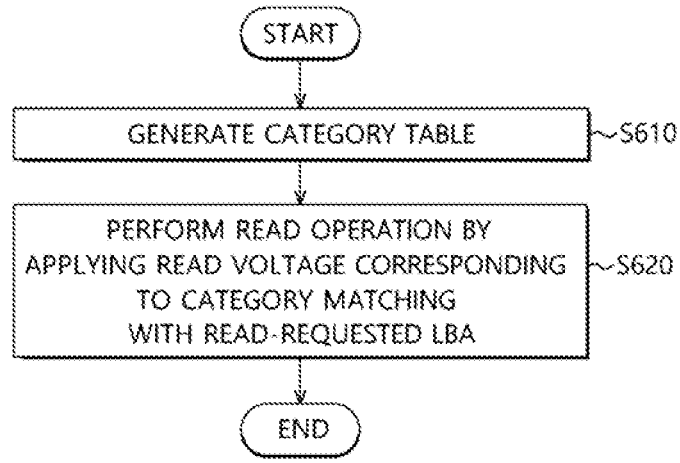
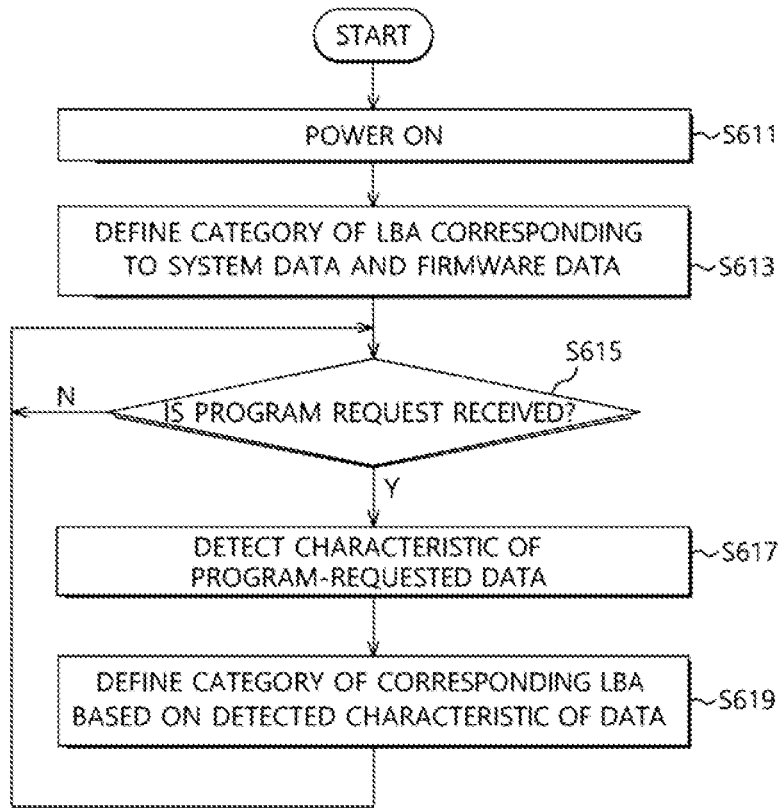

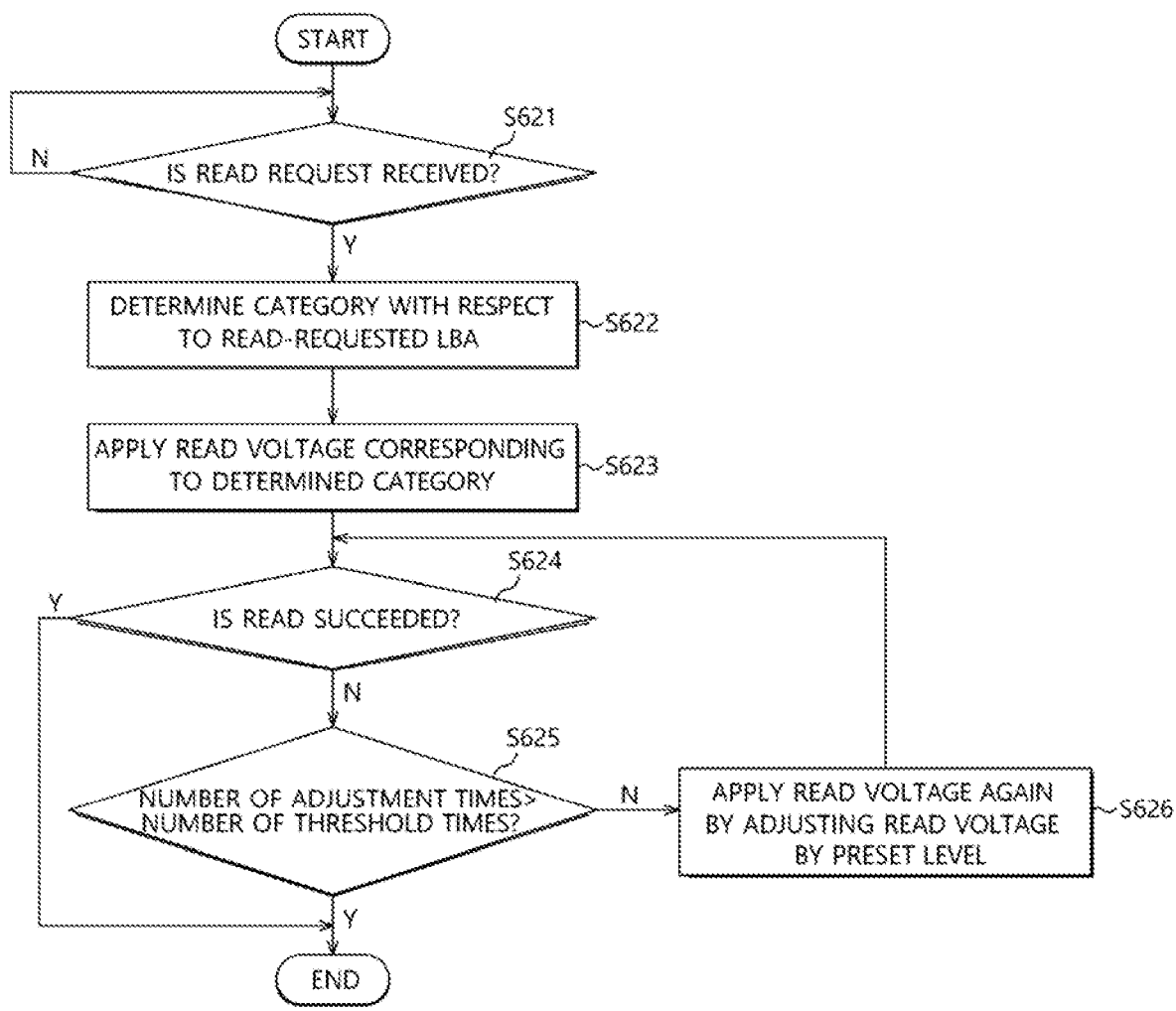

DATA STORAGE DEVICE AND OPERATING METHOD THEREOF

CROSS-REFERENCES TO RELATED APPLICATION

This application claims priority under 35 U.S.C. 119(a) to Korean application No. 10-2016-0048800, filed on Apr. 21, 2016, in the Korean intellectual property Office, which is incorporated herein by reference in its entirety as set forth in full.

BACKGROUND

1. Technical Field

Various embodiments of the present invention relate to a semiconductor apparatus and, more particularly, to a data storage device and an operating method thereof.

2. Related Art

In recent years, the paradigm for computer environments changed to ubiquitous computing which may use computer systems every time everywhere. As a result, use of portable electronic apparatuses such as a mobile phone, a digital camera, and a laptop computer has been increasing rapidly. Generally, portable electronic apparatuses use data storage devices that employ one or more semiconductor memory devices (simply referred to as memory devices) for storing data. Data storage devices may be used as auxiliary memory devices of the portable electronic apparatuses.

Data storage devices using memory devices have no mechanical driving units and exhibit good stability and endurance, fast information access rate, and low power consumption. Such data storage devices may include a universal serial bus (USB) memory device, a memory card having various interfaces, a solid state drive (SSD), and the like.

Data stored in a memory cell of a memory device may change or may be erroneously sensed due to interference or disturbance between memory cells. Data stored in a memory cell may also be changed due to wear caused by repeated erase/program operations. Stored data that are sensed as changed data due to various causes, include errors. When data errors are not corrected, a read operation is considered to a be a failed operation.

SUMMARY

Embodiments are provided to a data storage device capable of improving a success rate of a read operation and an operating method thereof.

In an embodiment, a data storage apparatus may include: a nonvolatile memory device; and a controller suitable for controlling an operation of the nonvolatile memory device. The controller may include a random access memory (RAM) including a category table in which categories with respect to logical block addresses (LBAs) are defined, and a read voltage table in which read voltages with respect to the categories are set; and the control unit configured to, when a read request and an LBA to be read are received, determine a category corresponding to the LBA with reference to the category table and perform a read operation on a read-requested memory cell of the nonvolatile memory device by applying a read voltage corresponding to the determined category to the memory cell with reference to the read voltage table.

In an embodiment, an operation method of a data storage device including a nonvolatile memory device and a controller suitable for controlling an operation of the nonvolatile memory device may include: receiving a read request including a logical block address (LBA); and determining a category corresponding to the received LBA with reference to a category table in which categories with respect to logical block addresses are defined; and performing a read operation on a read-requested memory cell of the volatile memory device by applying a read voltage corresponding to the determined category to the memory cell.

In an embodiment, a data storage apparatus may include: a nonvolatile memory device including a plurality of memory block regions for storing data; and a controller suitable for determining, in response to a read request, a read voltage among a plurality of read voltages corresponding to plurality of memory block regions based on a characteristic of the read-requested data; and performing a read operation on a read-requested memory cell of the nonvolatile memory device based on the read voltage.

According to the embodiments, in a read request from a host device, since a suitable read voltage and a suitable read voltage adjustment level may be easily determined according to a read-requested LBA, a success rate of the read operation may be increased and performance of the read operation may be improved.

These and other features, aspects, and embodiments are described below in the section entitled "DETAILED DESCRIPTION".

BRIEF DESCRIPTION OF THE DRAWINGS

The above and other aspects, features and advantages of the subject matter of the present disclosure will be more clearly understood from the following detailed description taken in conjunction with the accompanying drawings, in which:

FIG. 2 is a diagram illustrating an example of a category table, according to an embodiment of the present invention;

FIG. 3 is a diagram illustrating an example of a read voltage table, according to an embodiment of the present invention;

FIG. 6 is a flowchart illustrating an operation method of a data storage device, according to an embodiment of the present invention;

FIG. 7 is a detailed flowchart of an operation step of the operation method of FIG. 6;

FIG. 8 is a detailed flowchart of an operation step of the operation of FIG. 6;

DETAILED DESCRIPTION

Figure 1:
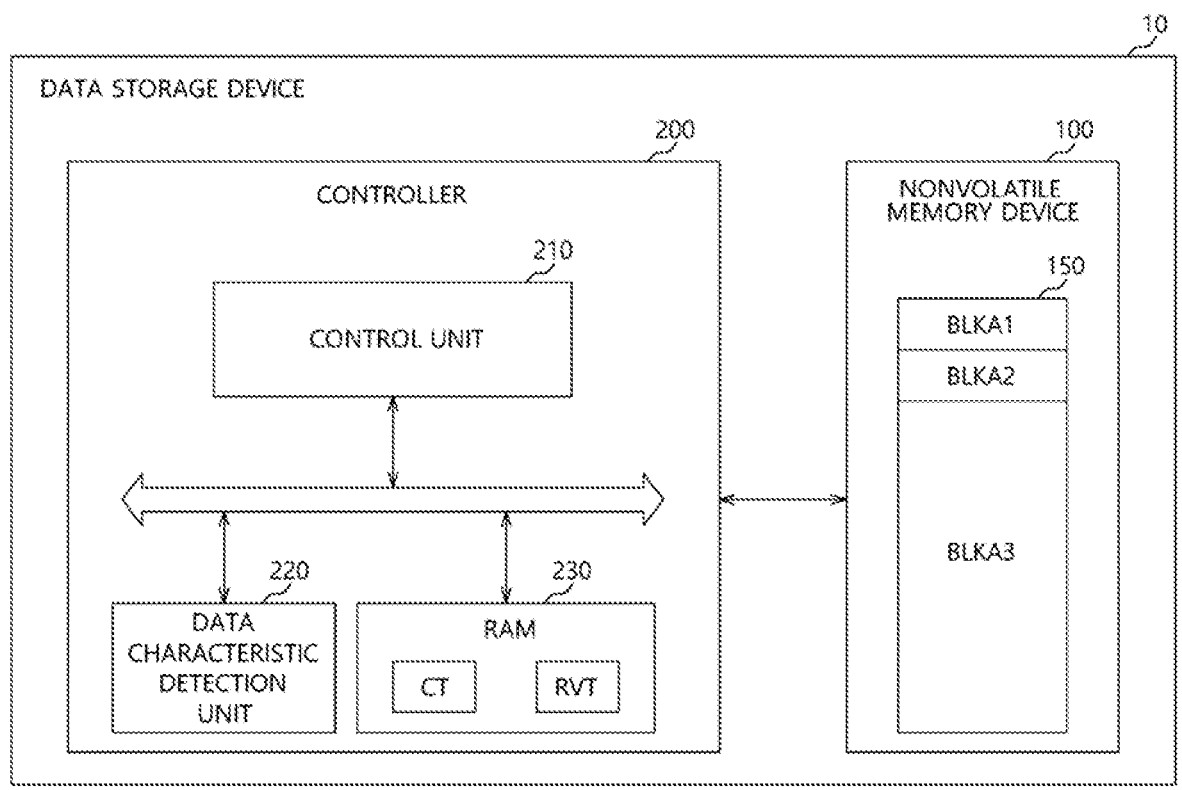
FIG. 1 is a block diagram illustrating a data storage device including a controller and a nonvolatile memory device, according to an embodiment of the present invention.

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

It is further noted that in the drawings, lengths and sizes of the various elements are not necessarily drawn in scale. Some elements or regions may be exaggerated for clarity.

It is also noted that in this specification, "connected/coupled" refers to one component not only directly coupling another component but also indirectly coupling another component through an intermediate component. In addition, a singular form may include a plural form, and vice versa as long as it is not specifically mentioned.

The present invention is described herein with reference to cross-section and/or plan illustrations of idealized embodiments of the present invention. However, embodiments of the present invention should not be construed as limiting the present invention. Although a few embodiments of the present invention will be shown and described, it will be appreciated by those of ordinary skill in the art that changes may be made in these various embodiments without departing from the principles and spirit of the present invention.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "includes", and "Including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Referring now to FIG. 1 a data storage device 10 is provided, according to an embodiment of the present invention. The data storage device 10 may store data to be accessed by a host device (not shown) such as a mobile phone, an MP3 player, a laptop computer, a desktop computer, a game player, a television (TV), or an in-vehicle infotainment system, and the like. The data storage device 10 may also be referred to hereinafter as a memory system 10.

The data storage device 10 may be manufactured as any one among various storage apparatuses according to a protocol of an interface coupled to the host device. For example, the data storage device 10 may be configured of as any one of various storage devices, such as a solid state drive (SSD), a multimedia card in the form of an MMC, an eMMC, an RS-MMC, and a micro-MMC, a secure digital card in the form of an SD, a mini-SD, and a micro-SD, a universal serial bus (USB) storage device, a universal flash storage (UFS) device, a personal computer memory card international association (PCMCIA) card type of storage device, a peripheral component interconnection (PCI) card type storage device, a PCI-express (PCI-E) card type storage device, a compact flash (CF) card, a smart media card, and a memory stick, and the like.

The data storage device 10 may be manufactured as any one among various packages. For example, the data storage device 10 may be manufactured as any one of various packages, such as a package on package (POP), a system in package (SIP), a system on chip (SOC), a multi-chip package (MCP), a chip on board (COB), a wafer-level fabricated package (WFP), and a wafer-level stack package (WSP).

The data storage device 10 may include a nonvolatile memory device 100 coupled to a controller 200.

The nonvolatile memory device 100 may be operated as a storage medium of the data storage device 10. The nonvolatile memory device 100 may be or include any suitable nonvolatile memory device, such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase-change random access memory (PRAM) using a chalcogenide alloy, and a resistive random access memory (RERAM) using a transition metal compound.

The nonvolatile memory device 100 may include a memory unit 150. The memory unit 150 may include a plurality of memory block regions. For example, the plurality of memory block regions may include a first memory block region BLKA1, a second memory block region BLKA2, and a third memory block region BLKA3. Each of the first memory block region BLKA1, the second memory block region BLKA2, and the third memory block region BLKA3 may include a plurality of memory blocks. System data may be stored in the first memory block region BLKA1. Firmware data may be stored in the second memory block region BLKA2. User data may be stored in the third memory block region BLKA3.

The firmware data may be data driven to control general operations of the data storage device 10. The system data may be data required for driving of the firmware data, and may include a variety of data such as a map table and initialization information, operation bias information, operation timing information, bad block information, and repair information of the nonvolatile memory device 100. The firmware data and the system data may be stored in a predetermined memory block in a test level after fabrication of the nonvolatile memory device 100. The firmware data and system data may be loaded into a random access memory (RAM) 230 for fast accessing when the data storage device 10 is powered on.

The controller 200 may include a control unit 210, a data characteristic detection unit 220, and a RAM 230 operatively coupled via an internal bus.

The control unit 210 may control general operations of the controller 200. For example, the control unit 210 may analyze and process a signal, a command, or request received from a host device. For example, when a read request including a logical block address (LBA) (hereinafter, referred to as a logical address) to be read are received from the host device, the control unit 210 may read data from a memory region of the nonvolatile memory device 100 based on the received logical address. Also, when a program request, a logical address to be programmed, and data to be programmed (user data) are received from the host device, the control unit 210 may store the data in the nonvolatile memory device 100 based on the received logical address. To this end, the control unit 210 may decode and drive the firmware data loaded into the RAM 230. The control unit 210 may be implemented in a hardware form or in a combined form of hardware and software.

When the program request, the logical address to be programmed, and the data to be programmed are received from the host device, the data characteristic detection unit 220 may detect a characteristic of the received data. For example, the data characteristic detection unit 220 may detect a size of the received data. In an embodiment, when the program request is received from the host device, the logical address to be programmed and length information of the data to be programmed may also be received. The data characteristic detection unit 220 may detect the size of the data based on the length information of the data received from the host device. An example, where the detected characteristic of the data is the size of the data has been described, however, the invention is not limited in this way and some other characteristic of the data may also be detected by the data characteristic detection unit 220.

The RAM 230 may store the firmware data driven by the control unit 210. The RAM 230 may store the system data required for the driving of the firmware data. That is, the RAM 230 may be operated as a working memory of the control unit 210.

The RAM 230 may temporarily store data to be transmitted from the host device to the nonvolatile memory device 100 or data to be transmitted from the nonvolatile memory device 100 to the host device. That, the RAM 230 may be operated as a buffer memory.

The controller 200 may further include a category table CT and a read voltage table RVT. For example, the RAM 230 may include the category table CT and the read voltage table RVT as illustrated in the embodiment of FIG. 1.

FIG. 2 is a diagram illustrating an example of the category table CT, according to an embodiment of the inventive concept. FIG. 3 is a diagram illustrating an example of the read voltage table RVT, according to an embodiment of the present invention.

Referring to FIG. 2, the category table CT may be configured of logical addresses LBA and categories defined with respect to the logical addresses LBA. The category table CT may be generated and managed through the control unit 210.

The categories may refer to data programmed in physical block addresses (PBA) (hereinafter, referred to as physical addresses) of the nonvolatile memory device 100 corresponding to the logical addresses.

The categories of the category table CT may, for example, include a system data category, a firmware (FW) data category, a hot data category, a cold data category, and the like. The categories are not limited only to the ones shown in FIG. 2. The system data and the FW data may be data stored in the first memory block region BLKA1 and the second memory block region BLKA2 of the memory unit 150 in the nonvolatile memory device 100, respectively. The hot data and the cold data may be user data stored in the third memory block region BLKA3 of the memory unit 150 in the nonvolatile memory device 100.

When the data storage device 10 is powered on, the control unit 210 may load the system data and the firmware data stored in the first memory block region BLKA1 and the second memory block region BLKA2 of the memory unit 150 of the nonvolatile memory device 100 into the RAM 230. The control unit 210 may generate the category table CT by defining categories (that is, the system data and the firmware data) corresponding to the logical addresses mapped with the physical addresses of the first memory block region BLKA1 and the second memory block region BLKA2 in which the system data and the firmware data are stored with reference to a map table. The control unit 210 may store the generated category table CT in the RAM 230.

For example, when the first memory block region BLKA1 of the memory unit 150 in the nonvolatile memory device 100 maps with logical addresses LBA0 to LBA1000, and the second memory block region BLKA2 maps with logical address LBA1001 to LBA1200, as illustrated in FIG. 2, the control unit 210 may generate the category table CT that category information with respect to the logical addresses LBA0 to LBA1000 is defined to the system data, and category information with respect to the logical address LBA1001 to LBA1200 is defined to the FW data.

The control unit 210 may estimate a category of data to be programmed based on a characteristic of the data (e.g., a size of the data) detected through the data characteristic detection unit 220. For example, the control unit 210 may estimate the category of the corresponding data by comparing the size of the data detected through the data characteristic detection unit 220 with a predetermined threshold value. In this example, when the size of the data detected through the data characteristic detection unit 220 is less than or equal to the predetermined threshold value, the control unit 220 may estimate the category of the corresponding data to be the hot data category. When the size of the data detected through the data characteristic detection unit 220 exceeds the predetermined threshold value, the control unit 220 may estimate the category of the corresponding data to be the cold data category. The hot data may refer to data for which accessing (i.e., accessing for erase/program operations) from the host device occurs frequently, for example more than a predetermined number of times within a predetermined period of time. Cold data may refer to data for which accessing from the host device occurs infrequently after programming, e.g., equal to or less than a predetermined number of times within a predetermined period of time.

When the category of the data to be programmed is estimated as the hot data category, the control unit 210 may define the hot data category corresponding to the logical address in which the corresponding data is to be programmed and store the defined category and corresponding logical address LBA in the category table CT. When the category of the data to be programmed is estimated as the cold data category, the control unit 210 may define the cold data category corresponding to the logical address in which the corresponding data is to be programmed and store the defined category and corresponding logical address LBA in the category table CT. Such a category table is illustrated in FIG. 2.

The control unit 210 may store the generated category table CT in the nonvolatile memory device 100. For example, the control unit 210 may store the generated category table (CT) in the first memory block region BLKA1 of the nonvolatile memory device 100 in which the system data is stored. When the data storage device 10 is powered on, the control unit 210 may load the category table CT stored in the nonvolatile memory device 100 into the RAM 230. Also, whenever a program request is received from the host device, the control unit 210 may update the category table CT loaded into the RAM 230.

Referring to FIG. 3, the read voltage table RVT may be configured to include the categories of the category table CT, read voltages RV with respect to the categories, and read voltage adjustment levels RVAL with respect to the categories. The specific read voltages RV and read voltage adjustment levels RVAL assigned to each category in the Example of FIG. 3, will be described in more detail with reference to FIGS. 4A-4B and 5A-5C.

In an embodiment, the read voltage table RVT may be stored in the nonvolatile memory device 100, and when the data storage apparatus 10 is powered on, the read voltage table RVT may be loaded into the RAM 230.

In an embodiment, each memory cell of the nonvolatile memory device 100 may store single bit data (1-bit data). The memory cell may thus be a single-level cell (SLC). In another embodiment, each memory cell of the nonvolatile memory device 100 may store multi-bit data (e.g., 2-bit or more-bit data). The memory cell may thus be a multi-level cell (MLC). Hereinafter, an example where the memory cell is a MLC in which 2-bit data is stored will be described, but the memory cell is not limited thereto. A triple-level cell (TLC) in which 3-bit data is stored or a quad-level cell (QLC) in which 4-bit data is stored may also be employed.

Figure 4A:
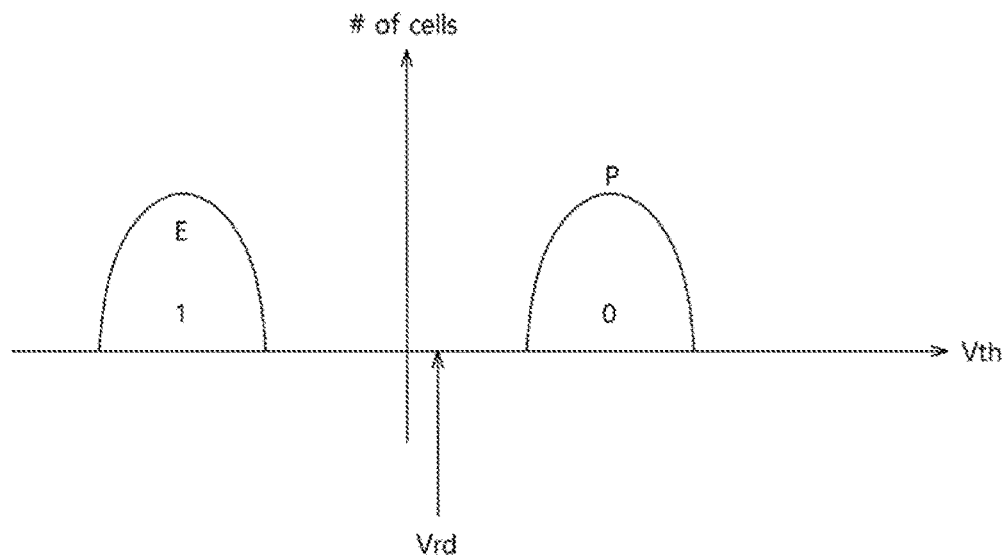
FIGS. 4A and 4B are diagrams illustrating examples of threshold voltage distributions of a memory cell of the nonvolatile memory device of FIG. 1.
Figure 4B:
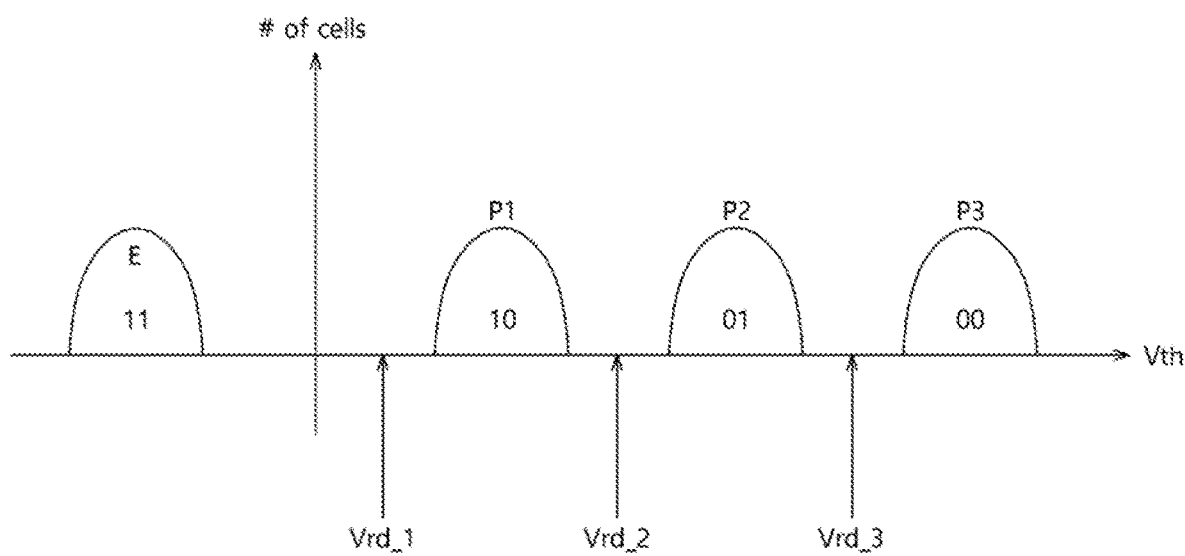

FIGS. 4A and 4B are diagrams illustrating threshold voltage distributions of memory cells of the nonvolatile memory device of FIG. 1. In FIG. 4A the memory cells are SLC memory cells. In FIG. 4B the memory cells are MLC memory cells in which 2-bit data is stored.

Referring to FIG. 4A, the SLC may be erased or programmed to have a threshold voltage distribution corresponding to an erase state E and a program state P, respectively. In a read operation, a read voltage Vrd having a voltage level between the erase state E and the program state P may be applied to a memory cell. When the read voltage Vrd is applied, a memory cell having a threshold voltage distribution of the erase state E may be determined to be an on cell which stores data "1", and a memory cell having the threshold voltage distribution of the program state P may be determined to be an off cell which stores data "0".

Referring to FIG. 4B, a 2-bit MLC memory cell may be erased or programmed to have the threshold voltage distribution corresponding to an erase state E and a plurality of program states P1 P2, and P3 according to the multi bit data, that is, least significant bit (LSB) data and most significant bit (MSB) data. In a read operation, any one of a first read voltage Vrd_1 having a voltage level between the erase state E and a first program state P1, a second read voltage Vrd_2 having a voltage level between the first program state P1 and a second program state P2, and a third read voltage Vrd_3 having a voltage level between the second program state P2 and a third program state P3 may be applied to a memory cell.

When the second read voltage Vrd_2 is applied, a memory cell having a threshold voltage distribution of the erase state E and the first program state P1 may be determined to be an on cell which stores the LSB data "1", and a memory cell having the threshold voltage distribution of the second program state P2 and the third program state P3 may be determined to be an off cell which stores the LSB data "0". When the first read voltage Vrd_1 is applied, a memory cell having the threshold voltage distribution of the erase state E may be determined to be an on cell which stores the MSB data "1", and a memory cell having the threshold voltage distribution of the first program state P1 may be determined to be an off cell which stores the MSB data "0". When the third read voltage Vrd_3 is applied, a memory cell having the threshold voltage distribution of the second program state P2 may be determined to be an on cell which stores the MSB data "1", and a memory cell having the threshold voltage distribution of the third program state P3 may be determined to be an off cell which stores the MSB data "0"

An example where the second read voltage Vrd_2 is used as a voltage for reading the LSB data, and the first read voltage Vrd_1 and the third read voltage Vrd_3 are used as a voltage for reading the MSB data has been described in FIG. 4B. However, when bit data symbols which are defined by the erase state E and the first to third program states P1 to P3 are differently set from those in the above-descried example, the read voltage for reading the LSB data and the read voltage for reading the MSB may be changed in conformity with the bit data symbols.

In the described embodiment, as an example, the system data and the firmware data may be stored in the SLC memory cells for a stable operation of the data storage device 10 and the hot data and the cold data as the user data may be stored in the MLC memory cells for taking advantage of the increased storage capacity of the MLC memory cells. However, the invention is not limited in this way.

Referring again to FIG. 3, the read voltages RV in the read voltage table RVT may include one system data read voltage Vrd_s with respect to the system data, one firmware data read voltage Vrd_f with respect to the firmware data, first to third hot data read voltages Vrd_h1, Vrd_h2, and Vrd_h3 with respect to the hot data, and first to third cold data read voltages Vrd_c1, Vrd_c2, and Vrd_c3 with respect to the cold data.

The system data read voltage Vrd_s, the firmware data read voltage Vrd_f, the first to third hot data read voltages Vrd_h1, Vrd_h2, and Vrd_h3, and the first to third cold data read voltages Vrd_c1, Vrd_c2, and Vrd_c3 may have different voltage levels from each other.

The threshold voltage distributions of the memory cell illustrated in FIGS. 4A and 4B may be unintentionally changed due to various factors. For example, as the erase/program operations of the memory cell are repeated, a defect of an insulating layer of a NAND flash memory cell used in the nonvolatile memory device 100 in FIG. 1 may occur. The defect of the insulating layer may cause problems such as hot ion emission, charge diffusion, program disturbance, high temperature stress, and over program, and thus a charge retention characteristic of the memory cell may be changed. Accordingly, the threshold voltage distribution of the memory cell may be changed. The change in the threshold voltage distribution of the memory cell may cause a read margin reduction and a read error.

When a read error occurs, the read operation may be performed on a read-requested memory cell again by adjusting a level of a read voltage to be applied to the read-requested memory cell and applying the level-adjusted read voltage to the read-requested memory cell.

The read voltage adjustment level RVAL of the read voltage table RVT in the embodiment may include a first read voltage adjustment level ΔVs for adjusting a level of the system data read voltage Vrd_s, a second read voltage adjustment level ΔVf for adjusting a level of the firmware data read voltage Vrd_f, a third read voltage adjustment level ΔVh for adjusting levels of the first to third hot data read voltages Vrd_h1, Vrd_h2, and Vrd_h3, and a fourth read voltage adjustment level ΔVc for adjusting levels of the first to third cold data read voltages Vrd_c1, Vrd_c2, and Vrd_c3.

Magnitudes of the first read voltage adjustment level ΔVs, the second read voltage adjustment level ΔVf, the third read voltage adjustment level ΔVh, and the fourth read voltage adjustment level ΔVc may be different from each other.

Adjustment directions of the first read voltage adjustment level ΔVs, the second read voltage adjustment level ΔVf, the third read voltage adjustment level ΔVh, and the fourth read voltage adjustment level ΔVc may be different from each other. The adjustment direction may refer to an increase in the voltage level or a decrease in the voltage level.

Figure 5A:
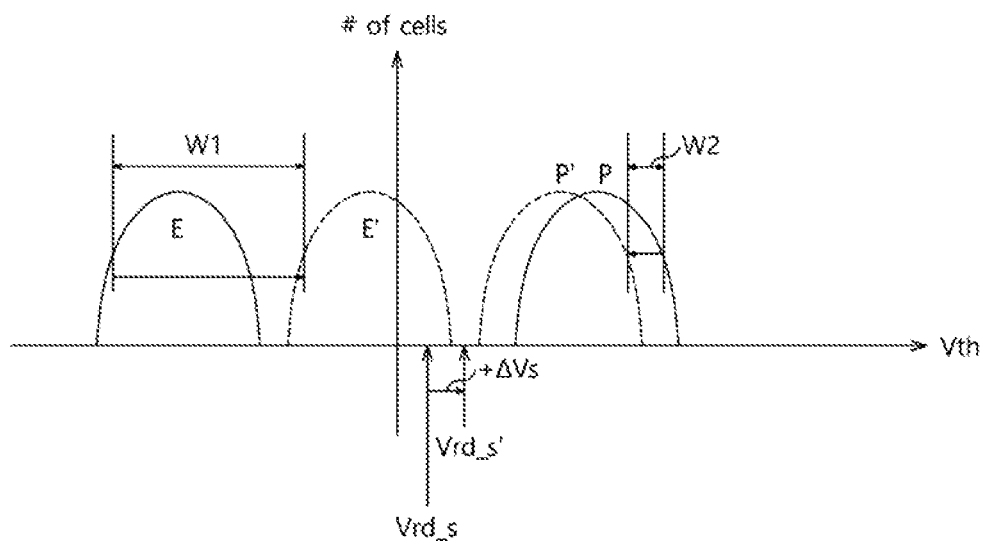
FIGS. 5A to 5C are diagrams illustrating examples of changed threshold voltage distributions of a memory cell of the nonvolatile memory device of FIG. 1.

Since the system data and the firmware data are data required for the driving of the data storage device 10, the system data and the firmware data may be programmed once, and then only the read operation on the system data and the firmware data may be continuously repeated. Accordingly, the threshold voltage distribution of the erase state E and the threshold voltage distribution of the program state P in the system data and the firmware data may be varied as illustrated in FIG. 5A. An example of the threshold voltage distribution of the system data is illustrated in FIG. 5A.

Referring to FIG. 5A, the threshold voltage distribution of the erase state E in the system data may be right-shifted as illustrated by E', and the threshold voltage distribution of the program state P in the system data may be left-shifted as illustrated by P'. A shift width W1 of the threshold voltage distribution of the erase state E may be larger than a shift width W2 of the threshold voltage distribution of the program state P. Accordingly, since the original system data read voltage Vrd_s is included in the shifted threshold voltage distribution of the erase state E', the read error may occur. For the read operation to succeed, the system data read voltage Vrd_s has to have a voltage level between the shifted erase state E' and the shifted program state P'. Since the system data read voltage Vrd_s is necessarily right-shifted as illustrated by Vrd_s', the system data read voltage Vrd_s may be adjusted to be increased by the first read voltage adjustment level +ΔVs.

The erase/program operations with respect to the hot data may be continuously repeated, and charges remaining in an insulating layer of the memory cell in which the hot data is stored may be generated. Accordingly, the threshold voltage distributions of the erase state E and the program states P1 to P3 may be varied as illustrated in FIG. 5B.

Figure 5B:
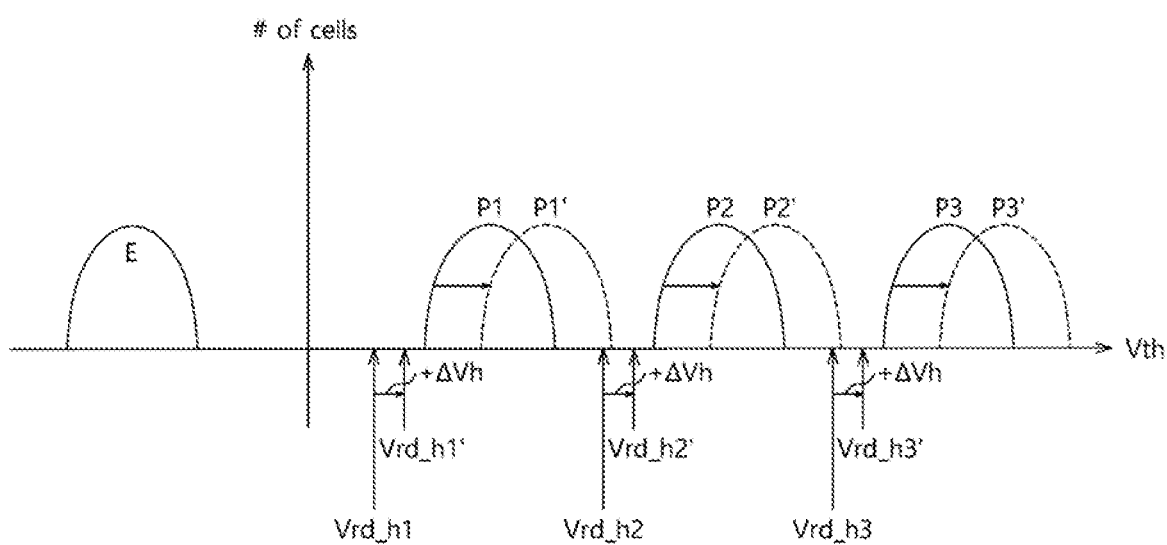

Referring to FIG. 5B, the threshold voltage distributions of the first to third program states P1, P2, and P3 may be right-shifted as illustrated by the shifted threshold voltage distributions P1', P2', and P3'. Although not shown in FIG. 5B, the threshold voltage distribution of the erase state E may also be right-shifted. Since the original second hot data read voltage Vrd_h2 may be included in the shifted threshold voltage distribution of the first program state P1' and the original third hot data read voltage Vrd_h3 may be included in the shifted threshold voltage distribution of the second program state P2', read errors may occur.

Since the first to third hot data read voltages Vrd_h1, Vrd_h2, and Vrd_h3 have to be right-shifted as illustrated by Vrd_h1', Vrd_h2', and Vrd_h3', the first to third hot data read voltages Vrd_h1, Vrd_h2, and Vrd_h3 may be adjusted to be increased by the third read voltage adjustment level +ΔVh.

Figure 5C:
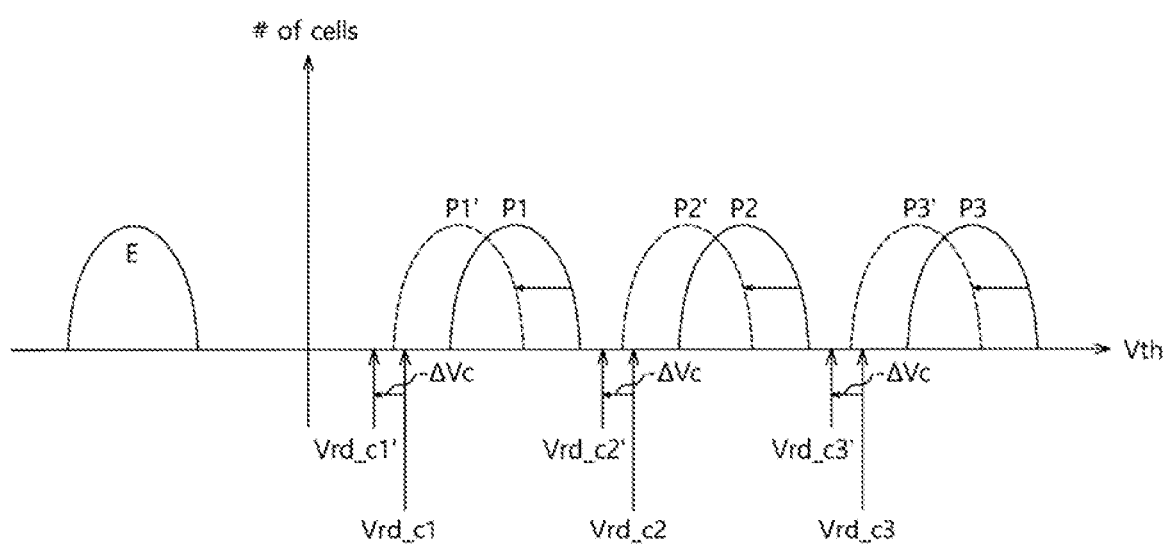

The cold data may not be accessed from the host device for a long time after the cold data is programmed once. Charges injected into the memory cell in which the cold data is stored may be leaked. Accordingly, as illustrated in FIG. 5C, the threshold voltage distributions of the first to third programs states P1, P2, and P3 may be left-shifted as illustrated by P1', P2', and P3'.

Since the original first cold data read voltage Vrd_c1 may be included in the shifted threshold voltage distribution of the first program state P1', the original second cold data read voltage Vrd_c2 may be included in the shifted threshold voltage distribution of the second program state P2', and the original third cold data read voltage Vrd_c3 may be included in the shifted threshold voltage distribution of the third program state P3', read errors may occur.

Since the first to third cold data read voltages Vrd_c1, Vrd_c2, and Vrd_c3 have to be left-shifted as illustrated by Vrd_c1', Vrd_c2', and Vrd_c3', the first to third cold data read voltages Vrd_c1, Vrd_c2, and Vrd_c3 may be adjusted to be decreased by the third read voltage adjustment level −ΔVc.

As described above, the shift direction of the threshold voltage distribution may be changed according to the type of data, that is, according to the data category. Accordingly, the control unit 210 may estimate the shift direction of the threshold voltage distribution based on the data category. The control unit 210 may increase or decrease the read voltage by the read voltage adjustment level RVAL based on the estimated shift direction of the threshold voltage distribution.

In an embodiment, the control unit 210 may repeatedly perform the level adjustment operation on the read voltage RV a number of times until a maximum number equaling a predetermined threshold number is reached. In an embodiment, the control unit 210 may repeatedly perform the level adjustment operation on the read voltage RV until the read operation succeeds. In yet another embodiment, the control unit 210 may repeatedly perform the level adjustment operation on the read voltage RV a number of times until the read operation succeeds up to a maximum number equaling a predetermined threshold number.

The control unit 210 may adjust the read voltage adjustment level RVAL in real time. For example, the control unit 210 may adjust the magnitude of the read voltage adjustment level RVAL to be further increased or to be further decreased if necessary. In this example, when the number of erase/program operation times with respect to the hot data exceeds a predetermined threshold value, the magnitude of the corresponding read voltage adjustment level, that is, the magnitude of the third read voltage adjustment level ΔVh may be adjusted to be further decreased, and thus an adjustment width of the read voltage may be further finely controlled.

In an embodiment, when the read request is received from the host device, the control unit 210 may determine a category matching the read-requested logical address with reference to the category table CT. The control unit 210 may perform the read operation by applying a read voltage corresponding to the determined category to a read-requested memory cell of the nonvolatile memory device 100 with reference to the read voltage table RVT. When the read operation for the read-requested memory cell falls, the control unit 210 may repeat the read operation on the read-requested memory cell by adjusting the original read voltage based on a read voltage adjustment level corresponding to the determined category and the adjustment direction (level increase or level decrease) with reference to the read voltage table RVT and applying the adjusted read voltage to the read-requested memory cell.

Accordingly, in performing a read request received from the host device, the appropriate read voltage may be fast determined according to the read-requested logical address. Therefore, the success rate of the read operation may be increased, and the read operation performance may be improved.

FIG. 6 is a flowchart illustrating an operation method of a data storage device, according to an embodiment of the present invention.

At S610, the control unit (see 210 of FIG. 1) may generate the category table (see CT of FIGS. 1 and 2), in which the logical addresses are classified in categories. The generation of the category table S610 will be described in further detail with reference to FIG. 7.

At S620, the control unit 210 may perform the read operation by applying a read voltage corresponding to a category matching a logical address read-requested from the host device to a memory cell of the nonvolatile memory device (see 100 of FIG. 1). The S620 operation will be described in further detail with reference to FIG. 8.

FIG. 7 is a detailed flowchart illustrating the category table generation operation S610, according to an embodiment of the present invention.

At S611, the data storage device 10 may be powered on.

At S613, the control unit 210 may generate the category table CT by defining categories with respect to logical addresses mapping with physical addresses of the first memory block region BLKA1 and the second memory block region BLKA2 of the nonvolatile memory device 100 in which the system data and the firmware data are stored. The control unit 210 may load the system data and the firmware data stored in the first memory block region BLKA1 and the second memory block region BLKA2 of the nonvolatile memory device 100 into the RAM 230.

At S615, the control unit 210 may determine whether a program request is received from the host device. When the program request is received from the host device, then operation S617 may be performed. The logical address to be programmed and the data to be programmed may be received from the host device together with the program request.

At S617, the data characteristic detection unit 220 may detect a characteristic of the data to be programmed. For example, the data characteristic detection unit 220 may detect a size of the data to be programmed based on length information of the data to be programmed.

At S619, the control unit 210 may estimate a category of the logical address to be programmed based on the characteristic of the data (e.g., the size of the data) detected through the data characteristic detection unit 220, and store the estimated category in the category table CT by matching the estimated category with the corresponding logical address.

FIG. 8 is a detailed flowchart illustrating the read operation of S620 of FIG. 6, according to an embodiment of the present invention.

At S621, the control unit (see 210 of FIG. 1) may determine whether the read request is received from the host device. For example, the control unit 210 may determine whether the read request and the logical address to be read-requested are received from the host device. When the read request and the logical address to be read-requested are received from the host device, operation S622 may be performed.

At S622, the control unit 210 may determine a category with respect to the logical address read-requested from the host device with reference to the category table CT of the RAM (see 230 of FIG. 1).

At S623, the control unit 210 may perform the read operation by applying the read voltage corresponding to the determined category to the memory cell of the nonvolatile memory device 100 corresponding to the read-requested logical address with reference to the read voltage table RVT of the RAM 230.

At S624, the control unit 210 may determine whether the read operation with respect to the corresponding memory cell succeeds. When the read operation with respect to the memory cell succeeds (S624, Y), the corresponding read operation may be terminated. When the read operation with respect to the memory cell falls (S624, N), operation S625 may be performed.

At S625, the control unit 210 may determine whether the number of read voltage adjustments exceeds a predetermined threshold value. When the number of adjustment times exceeds the predetermined threshold value as the determination result, the corresponding read operation may be terminated in a state that the read operation with the corresponding memory cell fails. When the number of adjustment times is equal to or less than the predetermined threshold value, operation S626 may be performed.

At S626, the control unit 210 may perform the read operation on the memory cell again by adjusting the read voltage by the read voltage adjustment level corresponding to the corresponding category with reference to the read voltage table RVT of the RAM 230 and applying the adjusted read voltage to the memory cell. After performing S626, step S624 may be repeated.

Figure 9:
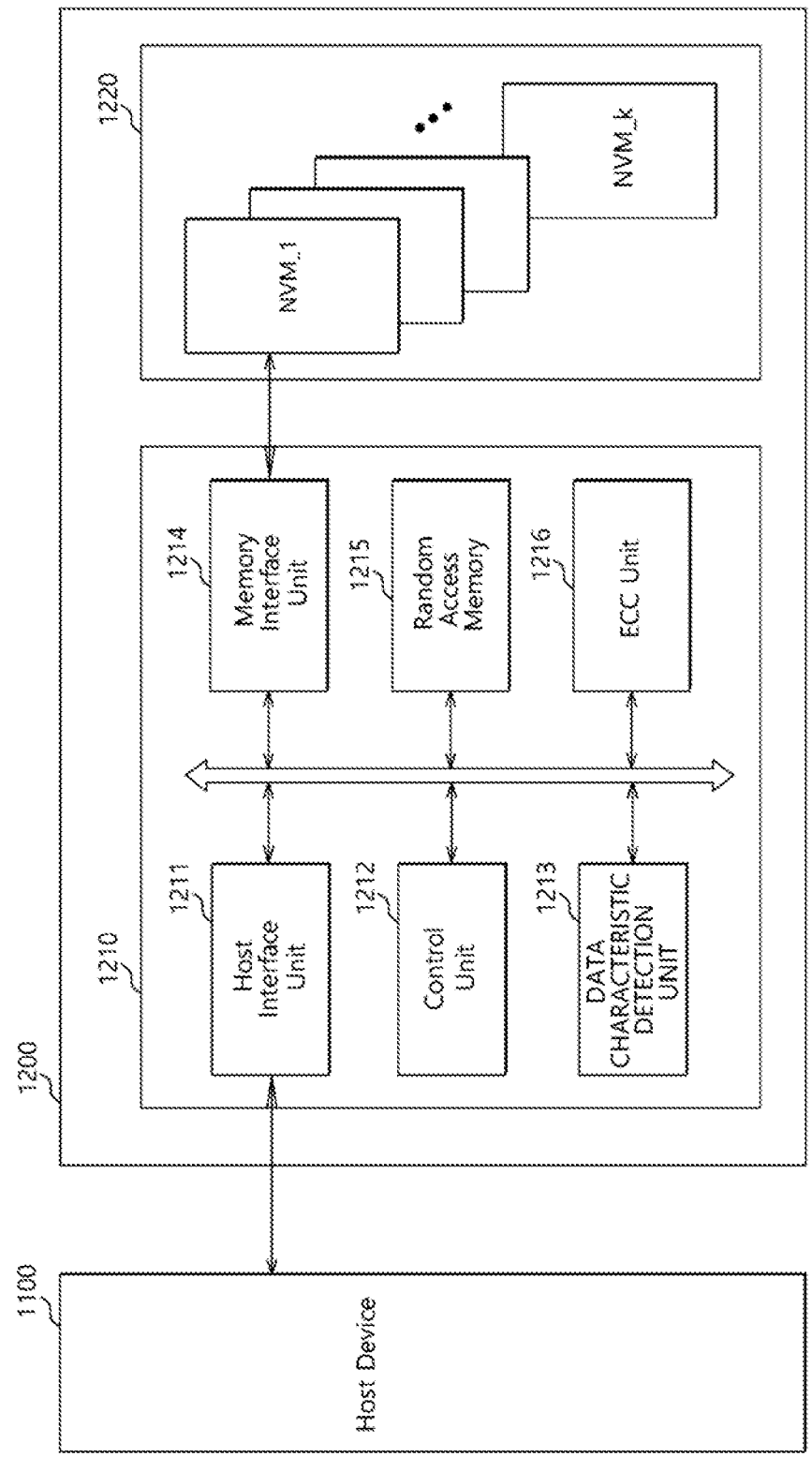
FIG. 9 is a block diagram illustrating a data processing system including a data storage device coupled to a host device, according to an embodiment of the present invention.

FIG. 9 is a block diagram illustrating a data processing system 1000 including a data storage apparatus 1200 according to various embodiments of the present technical spirit.

Referring to FIG. 9, data processing system 1000 may include a host device 1100 coupled to the data storage device 1200.

The data storage device 1200 may include a controller 1210 and a nonvolatile memory device 1220. The data storage device 1200 may be used through coupling to the host device 1100. The host device 1100 may be, for example, a portable phone, an MP3 player, a laptop computer, a desktop computer, a gaming terminal, a television (TV), or an in-vehicle infotainment system. The data storage device 1200 may also be referred to as a memory system.

The controller 1210 may include a host interface unit 1211, a control unit 1212, a data characteristic detection unit 1213, a memory interface unit 1214, a random access memory (RAM) 1215, and an error correction code (ECC) unit 1216 interlinked via an internal bus.

The data characteristic detection unit 1213 may detect a characteristic of data program-requested from the host device 1100.

The RAM 1215 may be used as a working memory of the control unit 1212. The RAM 1215 may be used as a buffer memory which temporarily stores data read from the nonvolatile memory device 1220 or data provided from the host device 1100. A category table, in which category information with respect to a logical address is defined, and a read voltage table, in which a read voltage with respect to the category is set are stored in the RAM 1215.

The control unit 1212 may generate the category table by defining the category information of corresponding data based on a characteristic of the data detected through the data characteristic detection unit 1213. The control unit 1212 may determine category information with respect to a logical address read-requested from the host device 1100 with reference to the category table, and apply a read voltage corresponding to the determined category information to a memory cell of the nonvolatile memory device 1220 with reference to the read voltage table.

The host interface unit 1211 may perform interfacing between the host device 1100 and the controller 1210. For example, the host interface 1211 may communicate with the host device 1100 through one of various interface protocols such as a USB protocol, a UFS protocol, a MMC protocol, a PCI protocol, a PCI-E protocol, a parallel advanced technology attachment (PATA) protocol, a serial advanced technology attachment (SATA) protocol, a small computer system interface (SCSI) protocol, and a serial attached SCSI (SAC) protocol.

The memory interface unit 1214 may perform interfacing between the controller 1210 and the nonvolatile memory device 1220. The memory interface unit 1214 may provide a command and an address to the nonvolatile memory device 1220. The memory interface unit 1214 may exchange data with the nonvolatile memory device 1220.

The ECC unit 1216 may perform ECC encoding on data to be stored in the nonvolatile memory device 1220. The ECC unit 1216 may perform ECC decoding on data read from the nonvolatile memory device 1220. The ECC unit 1216 may be included in the memory interface unit 1214.

The controller 1210 and the nonvolatile memory device 1220 may be fabricated with any one of various data storage apparatuses. For example, the controller 1210 and the nonvolatile memory device 1220 may be integrated with one semiconductor device and may be fabricated with any one among MMC, eMMC, RS-MMC, micro-MMC MMCs, SD, mini-SD, micro-SD SD cards, a USB storage apparatus, a UFS apparatus, a PCMCIA card, a CF card, a smart media card, and a memory stick.

Figure 10:
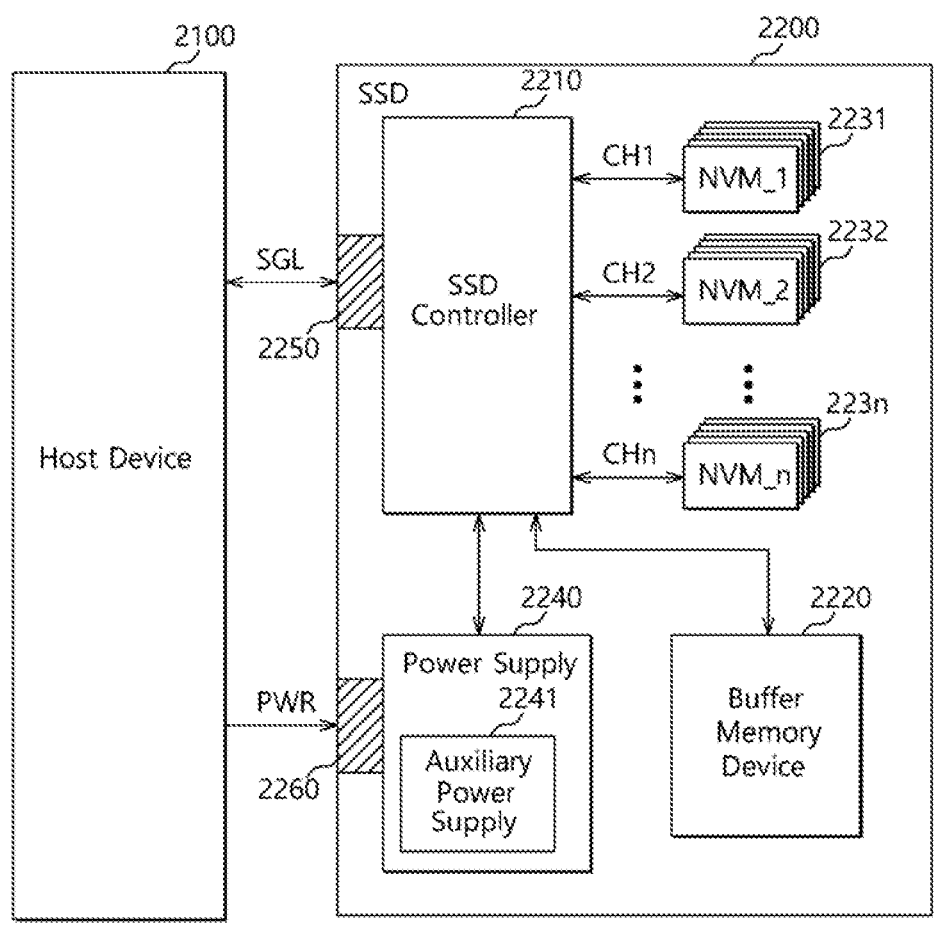
FIG. 10 is a block diagram illustrating a data processing system including a solid state drive (SSD), according to an embodiment of the present invention.

FIG. 10 is a block diagram illustrating a data processing system 2000 including a solid state drive (SSD) 2200 according to various embodiments of the present invention.

Referring to FIG. 10, the data processing system 2000 may include a host device 2100 and the SSD 2200.

The SSD 2200 may include a SSD controller 2210, a buffer memory device 2220, nonvolatile memory devices 2231 to 223n, a power supply 2240, a signal connector 2250, and a power connector 2260.

The SSD controller 2210 may access the nonvolatile memory devices 2231 to 223n in response to a request from the host device 2100.

The buffer memory device 2220 may temporarily store data to be stored in the nonvolatile memory devices 2231 to 223n. The buffer memory device 2220 may temporarily store data read from the nonvolatile memory devices 2231 to 223n. The data temporarily stored in the buffer memory device 2220 may be transmitted to the host device 2100 or the nonvolatile memory devices 2231 to 223n according to control of the SSD controller 2210.

The nonvolatile memory devices 2231 to 223n may be used as a storage medium of the SSD 2200. The nonvolatile memory devices 2231 to 223n may be coupled to the SSD controller 2210 through a plurality of channels CH1 to CHn. One or more nonvolatile memory devices may be coupled to one channel. The nonvolatile memory devices coupled to the one channel may be coupled to the same signal bus and the same data bus.

The power supply 2240 may provide power PWR input through the power connector 2260 to the inside of the SSD 2200. The power supply 2240 may include an auxiliary power supply 2241. The auxiliary power supply 2241 may supply the power so that the SSD 2200 is normally terminated when sudden power-off occurs. The auxiliary power supply 2241 may include large capacity capacitors capable of charging the power PWR.

The SSD controller 2210 may exchange a signal SGL with the host device 2100 through the signal connector 2250. The signal SGL may include a command, an address, data (e.g., user data), and the like. The signal connector 2250 may be configured of a connector such as a PATA, SATA, SCSI, SAC, SAS, PCI, and PCI-E which are well-known in the art.

Figure 11:
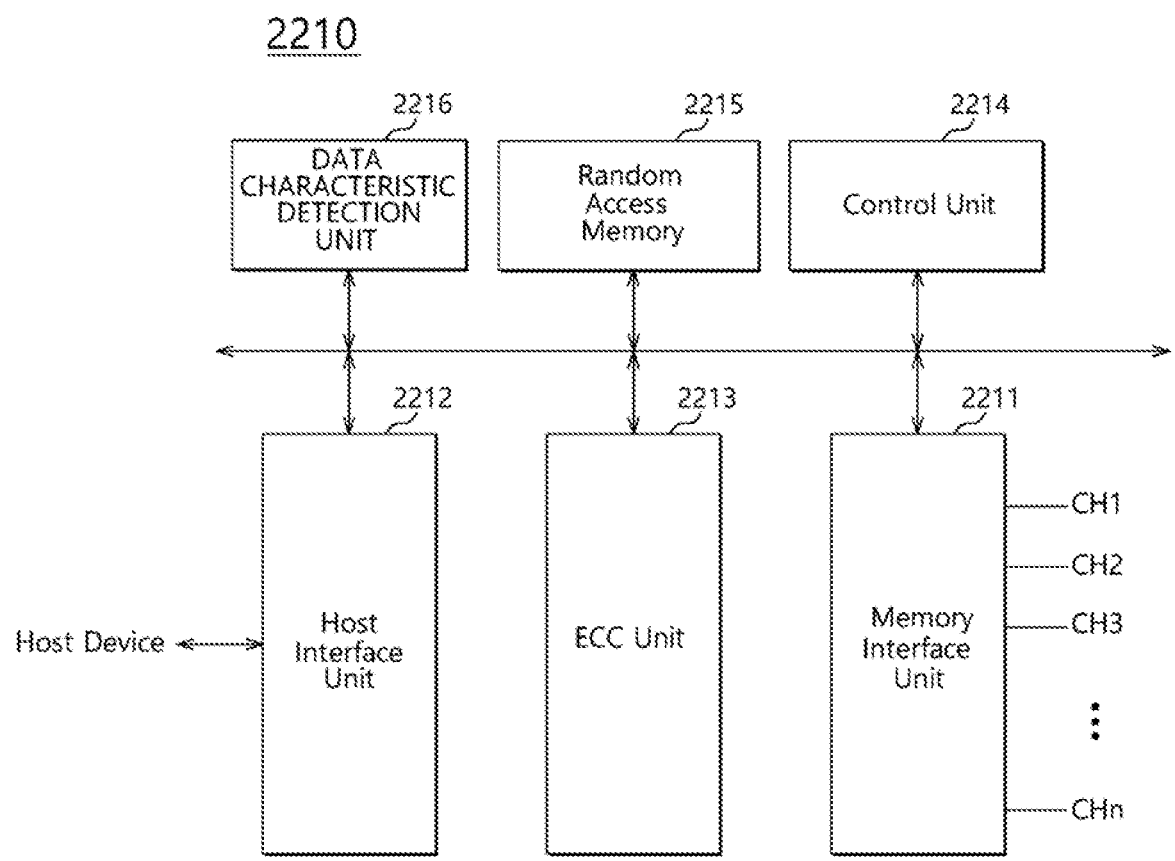
FIG. 11 is a block diagram illustrating a solid state drive (SSD) controller of FIG. 10.

FIG. 11 is a block diagram illustrating an example configuration of the SSD controller 2210 of FIG. 10.

Referring to FIG. 11, the SSD controller 2210 may include a memory interface unit 2211, a host interface unit 2212, an error correction code (ECC) unit 2213, a control unit 2214, a random access memory (RAM) 2215, and a data characteristic detection unit 2216.

The memory interface unit 2211 may provide a control signal such as a command and an address to the nonvolatile memory devices 2231 to 223n. The memory interface unit 2211 may exchange data with the nonvolatile memory devices 2231 to 223n. The memory interface unit 2211 may perform distributing on data transferred from the buffer memory device 2220 to the channels CH1 to CHn according to control of the control unit 2214. The memory interface unit 2211 may transfer the data read from the nonvolatile memory devices 2231 to 223n to the buffer memory device 2220 according to control of the control unit 2214.

The host interface unit 2212 may perform interfacing with the SSD 2200 according to a protocol of the host device 2100. For example, the host interface unit 2212 may communicate with the host device 2100 through any one among a PATA protocol, a SATA protocol, a SCSI protocol, a SAC protocol, a SAS protocol, a PCI protocol, and a PCI-E protocol.

The host interface unit 2212 may perform a disc emulation function so that the host device 2100 recognizes the SSD 220 as a hard disc drive HDD.

The control unit 2214 may analyze and process the signal SGL input from the host device 2100. The control unit 2214 may control operations of the buffer memory device 2220 and the nonvolatile memory devices 2231 to 223n according to firmware and/or software for driving the SDD 2200.

The RAM 2215 may be operated as a working memory of the control unit 2214. The category table including the category information for the logical address is defined, and the read voltage table including the read voltages for the various categories may be stored in the RAM 2215.

The data characteristic detection unit 2216 may detect a characteristic of the data which are program-requested from the host device 2100.

The control unit 2214 may generate the category table by defining category information of corresponding data based on the characteristic of the data detected through the data characteristic detection unit 2216. The control unit 2214 may determine category information with respect to a logical address read-requested from the host device 2100 with reference to the category table, and apply a read voltage corresponding to the determined category information to a memory cell of the nonvolatile memory devices 2231 to 223n with reference to the read voltage table.

The ECC unit 2213 may generate parity data for the data to be transferred to the nonvolatile memory devices 221 to 223n among pieces of data stored in the buffer memory device 2220. The generated parity data may be stored in the nonvolatile memory devices 2231 to 223n together with the data. The ECC unit 2213 may detect errors for data read from the nonvolatile memory devices 2231 to 223n. When detected errors are within a correctable range, the ECC unit 2213 may correct the detected errors.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A data storage device comprising:
a nonvolatile memory device; and
a controller suitable for controlling an operation of the nonvolatile memory device,
the controller including:
a random access memory (RAM) including a category table in which categories with respect to logical block addresses (LB As) are defined, and a read voltage table in which read voltages with respect to the categories are set; and
a control unit configured to, when a read request and an LBA to be read are received, determine a category corresponding to the LBA with reference to the category table and perform a read operation on a read-requested memory cell of the nonvolatile memory device by applying a read voltage corresponding to the determined category to the memory cell with reference to the read voltage table,
wherein the categories corresponding to the LBAs indicates a-types of data programmed in physical block addresses of the nonvolatile memory device corresponding to the LBAs, and
wherein the types of data include a first type of data that can only be read and a second type of data that can be programmed, read and erased.

2. The data storage device of claim 1, wherein the controller stores matching information of an LBA mapping with a memory block of the nonvolatile memory device in which data is pre-stored and a category of the pre-stored data in the category table.

3. The data storage device of claim 2, wherein the data pre-stored in the nonvolatile memory device includes system data and firmware data, and
wherein the system data and the firmware data are the first type of the data.

4. The data storage device of claim 1, further including a data characteristic detection unit configured to detect a characteristic of the second type of the data to be programmed when a program request, an LBA, and the second type of the data to be programmed are received,
wherein the control unit estimates whether the second type of the data to be programmed is hot data or cold data based on the detected characteristic of the second type of the data to be programmed, and stores matching information of the estimation result of the second type of the data to be programmed and the LBA to be programmed.

5. The data storage device of claim 4, wherein the characteristic of the second type of the data includes a size of the second type of the data, and
the control unit determines whether the size of the second type of data is less than or equal to a predetermined threshold value or exceeds the predetermined threshold value and estimates whether the second type of the data to be programmed is the hot data or cold data based on a determination result.

6. The data storage device of claim 1, wherein the read voltage table further includes a read voltage adjustment level with respect to the category.

7. The data storage device of claim 6, wherein the control unit determines whether the read operation succeeds, and when the read operation fails, the control unit adjusts the read voltage by the read voltage adjustment level, and repeats the read operation on the read-requested memory cell by applying the adjusted read voltage to the read-requested memory cell.

8. The data storage device of claim 7, wherein the control unit determines whether the number of read voltage adjustments exceeds a predetermined threshold value after the read operation fails, adjusts the read voltage by the read voltage adjustment level and applies the adjusted read voltage to the read-requested memory cell when the number of read voltage adjustments is less than or equal to the predetermined threshold value, and terminates the read operation when the number of read voltage adjustments exceeds the predetermined threshold value.

9. The data storage device of claim 7, wherein the control unit estimates a shift direction of a threshold voltage distribution of the read-requested memory cell based on the category and increases or decreases the read voltage by the read voltage adjustment level according to the estimated shift direction.

10. An operation method of a data storage device including a nonvolatile memory device and a controller suitable for controlling an operation of the nonvolatile memory device, the method comprising:
receiving a read request including a logical block address (LBA)
determining a category corresponding to the received logical block address (LBA) with reference to a category table in which categories with respect to logical block addresses (LBAs) are defined; and
performing a read operation on a read-requested memory cell of the nonvolatile memory device by applying a read voltage corresponding to the determined category to the memory cell,
wherein the categories corresponding to the LBAs indicates types of data programmed in physical block addresses of the nonvolatile memory device corresponding to the LBAs, and
wherein the types of data include a first type of data that can only be read and a second type of data that can be programmed, read and erased.

11. The method of claim 10, further comprising generating the category table by including storing matching information of an LBA mapping with a memory block of the nonvolatile memory device in which data is pre-stored and a category of the pre-stored data in the category table when the data storage device is powered on.

12. The method of claim 11, wherein the data pre-stored in the nonvolatile memory device includes system data and firmware data, and
wherein the system data and the firmware data are the first type of the data.

13. The method of claim 11, wherein the generating of the category table further includes:
determining whether a program request, an LBA to be programmed, and the second type of the data to be programmed are received from the host device;
detecting a characteristic of the second type of the data to be programmed:
estimating whether the second type of the data to be programmed is a hot data or a cold data based on the detected characteristic of the second type of the data; and
storing matching information of the estimation result of the second type of the data to be programmed and the LBA to be programmed.

14. The method of claim 13, wherein the characteristic of the second type of the data includes a size of the second type of the data, and
wherein the estimating of the characteristic of the second type of the data includes:
determining whether the size of the second type of the data is equal to or less than a predetermined threshold value or exceeds the predetermined threshold value; and
estimating whether the second type of the data to be programmed is the hot data or the cold data based on a determination result.

15. The method of claim 10, further comprising: after the performing of the read operation,
determining whether the read operation succeeds;
adjusting the read voltage by a read voltage adjustment level corresponding to the determined category when the read operation fails; and
performing the read operation on the read-requested memory cell of the nonvolatile memory device again by applying the adjusted read voltage to the read-requested memory cell.

16. The method of claim 15, further comprising, before the adjusting of the read voltage, determining whether the number of read voltage adjustments exceeds a predetermined threshold value,
wherein the read voltage is adjusted by the read voltage adjustment level when the number of read voltage adjustments is less than or equal to the predetermined threshold value, and the read operation is terminated when the number of read voltage adjustments exceeds the predetermined threshold value.

17. The method of claim 15, wherein the adjusting of the read voltage includes:
estimating a shift direction in a threshold voltage distribution of the read-requested memory cell based on the category; and
increasing or reducing the read voltage by the read voltage adjustment level according to the estimated shift direction.

18. A data storage device comprising:
a nonvolatile memory device including a plurality of memory block regions for storing data; and
a controller suitable for:
determining, in response to a read request, a read voltage among a plurality of read voltages corresponding to plurality of memory block regions based on a characteristic of the read-requested data; and
performing a read operation on a read-requested memory cell of the nonvolatile memory device based on the read voltage,
wherein the characteristic of the read-requested data indicates a type of the read-requested data,
wherein the type of the read-requested data includes one of a first type of data that can only be read and a second type of data that can be programmed, read and erased,
wherein the first type of the data includes system data and firmware data, and
wherein the second type of the data includes user data having hot data and cold data.

19. The data storage device of claim 18, wherein the controller is further suitable for adjusting the read voltage by a read voltage adjustment level corresponding to the characteristic of the read-requested data if the read operation fails, and performing a read operation on the read-requested memory cell based the adjusted read voltage.

* * * * *